United States Patent [19]

Rae et al.

[11] 4,203,073
[45] May 13, 1980

[54] RADIO RECEIVER BLANKER GATE

[75] Inventors: James W. Rae, Schaumburg; Larry R. Wright, Glenview, both of Ill.

[73] Assignee: Motorola, Inc., Schaumburg, Ill.

[21] Appl. No.: 875,977

[22] Filed: Feb. 6, 1978

Related U.S. Application Data

[63] Continuation of Ser. No. 670,500, Mar. 25, 1976, abandoned.

[51] Int. Cl.$^2$ .............................................. H04B 1/10
[52] U.S. Cl. .................................... 455/311; 333/177; 328/100; 455/212
[58] Field of Search ............... 325/479, 477, 313, 489, 325/478; 307/241, 242; 333/77, 78; 328/95, 96, 100

[56] References Cited

U.S. PATENT DOCUMENTS

| | | | |
|---|---|---|---|
| 3,191,124 | 6/1965 | Brown | 325/478 |
| 3,337,749 | 8/1967 | Lee | 307/242 |
| 3,343,099 | 9/1967 | Paul | 325/478 |
| 3,623,144 | 11/1971 | Fischel | 325/479 |

OTHER PUBLICATIONS

Impulse Noise Reduction Circuit for Communication Receivers, W. F. Chow, Transactions of the Ire, pp. 348 to 353, 1960 May, vol. VC-9.

Primary Examiner—Benedict V. Safourek
Assistant Examiner—Tommy P. Chin
Attorney, Agent, or Firm—Phillip H. Melamed; James W. Gillman

[57] ABSTRACT

A balanced, doubly tuned gate couples between the mixer and intermediate frequency (IF) stages of a conventional radio receiver. The network is comprised of a pair of matched transformers interconnected in a balanced configuration, with the first transformer tuned to the mixer and the remaining transformer tuned to the IF stage. Capacitors interconnect the two transformers resulting in a Butterworth filter network.

Two diode pairs connect in shunt across selected windings of the transformers. Direct current bias normally biases the diodes to a nonconducting state, thereby allowing the mixer signals to pass to the IF stage. A blanking signal from the receiver blanker drives the diodes to conduction thereby decoupling the mixer from the IF and blanking the receiver.

Due to the doubly balanced nature of the gate, blanking is accomplished with a minimum of switching time. Moreover, the shunt diode switching scheme provides superior attenuation in the blanking mode and enhanced operation in the normal mode.

22 Claims, 1 Drawing Figure

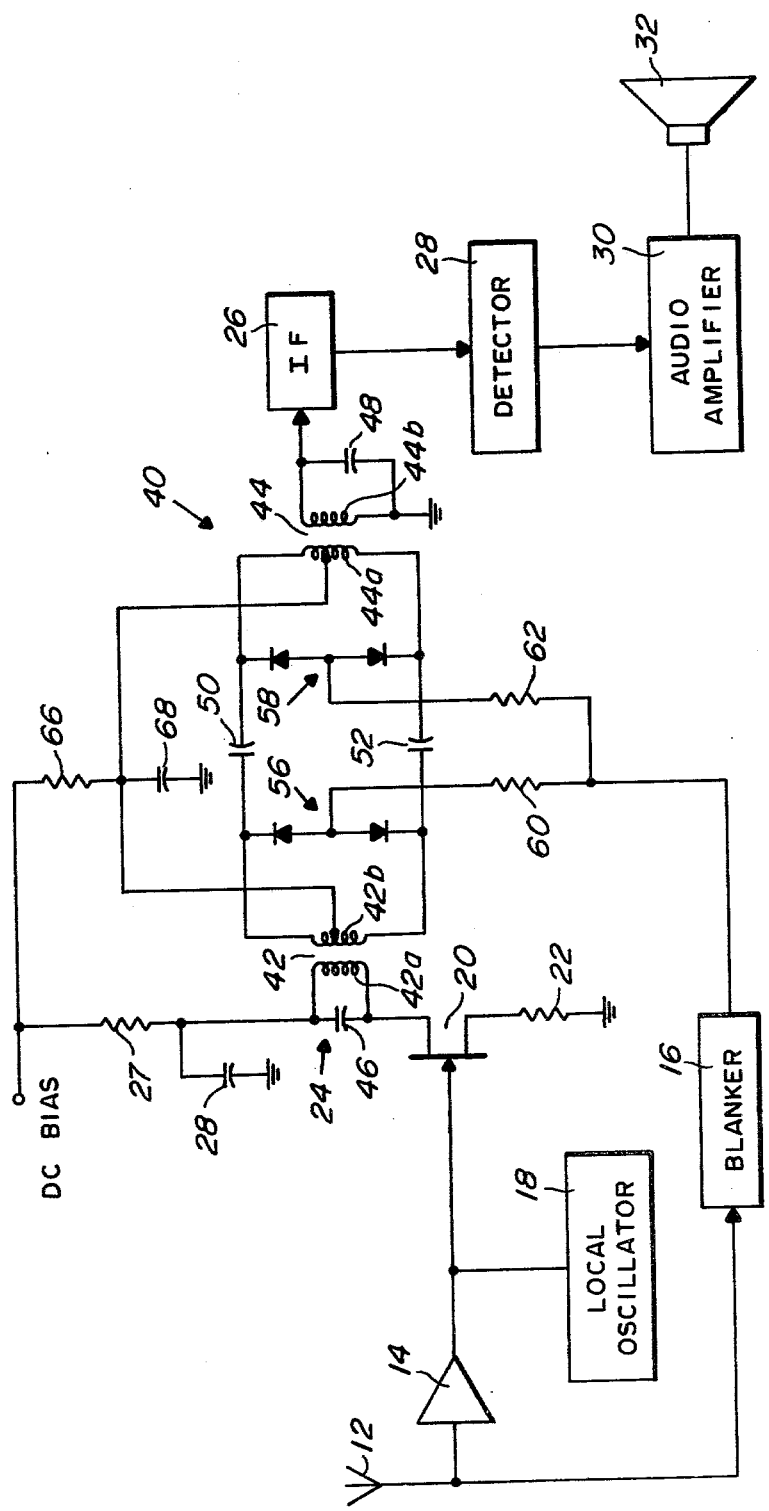

RADIO RECEIVER BLANKER GATE

This is a continuation of application Ser. No. 670,500, filed Mar. 25, 1976, now abandoned.

BACKGROUND OF THE INVENTION

The present invention pertains to the radio receiver blanking art and, in particular, to a doubly balanced blanker gate having symmetric, diode shunt switching.

Gating networks which provide a blanking function are well known in the ratio receiver art. Such gates are normally series connected in the receiver chain thus providing a means to gate the received signal in response to a blanking signal from the blanker.

Prior art blanking networks have, however, required engineering tradeoffs rendering a less than ideal blanking system. For example, since the blanker is inserted between two existing radio stages, impedance mismatches between the stages and the blanker gate may result in decreased signal transfer, and mistuning of the receiver, thereby retarding receiver sensitivity and signal to noise ratio. Since impedance matching to tuned stages normally implies a tuned network, tuned blankers have suffered from inadequate transient response. Fast turn-on and turn-off of a tuned circuit normally results in ringing which produces an annoying audible response from the receiver.

SUMMARY OF THE INVENTION

It is an object of this invention, therefore, to provide an improved blanker gate adapted for insertion in a conventional radio receiver design, which blanker gate provides proper impedance matching to the radio receiver stages while exhibiting superior transient response.

It is a particular object of the invention to provide the above improved blanker gate which incorporates a doubly balanced, symmetrically arranged shunt diode switching scheme.

Briefly, according to the invention, the improved blanker gate uses first and second transformers to couple between the stages of the radio receiver. The primary winding of the first transformer couples signals from the first receiver stage and the secondary of the second transformer couples signals to the succeeding receiver stage. The transformers have balanced characteristics and, preferably, are bifilar wound. A coupling means, preferably comprised of selected value capacitors, couples signals from the secondary of the first transformer to the primary winding of the second transformer. Where selective value capacitors are used, the capacitors and transformers may form a filter having a Butterworth response characteristic. Coupled in shunt across the coupling means, and therefore across either the secondary of the first transformer and/or the primary of the second transformer is a signal controlled switch. In normal receiver operation the switch is inactivated whereby signals may pass freely between the receiver stages. However, upon receipt of a blanking signal the switch is activated thereby effectively decoupling signals from the first transformer to the second transformer and blanking the receiver. A preferable signal controlled switch includes two diode pairs, each pair having their diodes interconnected anode to anode, with the cathodes connected to each one of the free ends of the first transformer secondary winding and the second transformer primary winding. A blanking signal is applied to the common anode connections thus biasing the diodes to a conducting state and blanking the receiver. Due to the doubly balanced nature of the blanking gate, along with the symmetric arrangement of diodes, the blanking action occurs with a minimum of ringing. To further enhance the networks operation, a D.C. bias voltage may be applied to the diodes whereby in normal receiver operation they are actively biased to an off state, thus eliminating any effect of the diode on the circuit.

BRIEF DESCRIPTION OF THE DRAWING

The attached drawing is a schematic diagram illustrating the incorporation of the improved blanker gate in a conventional radio receiver.

DETAILED DESCRIPTION OF THE PREFERRED EMBODIMENT OF THE INVENTION

The attached drawing is a schematic diagram for a radio receiver wherein radio frequencies (RF) signals are picked up by an antenna 12 and routed both to an RF amplification stage 14 and to a blanker circuit 16. The blanker circuit 16 is of conventional design, generating blanking pulses in response to excessive noise on the antenna 12 input signal. A local oscillator 18 mixes with the output of the RF amplifier 14 i an F.E.T. mixer stage 20. The mixer stage 20 includes a source resistor 22 to ground, and a load in the drain which includes a tuned tank circuit 24, a decoupling resistor 27 and an RF bypass capacitor 28. Load resistor 26 connects to a source of DC bias. The mixer 20 acts in a conventional manner to modulate signals from the RF amplifier 14 by the local oscillator signal 18, thereby translating the RF received signal to an intermediate frequency. In a conventional receiver the output from mixer 20 would directly connect to an IF stage 26 which amplifies and filters the IF frequency and thereafter to a conventional detector 28 which demodulates the RF signal to baseband information. The detected signal from detector 28 is passed through an audio amplifier 30 and thereafter to a speaker 32 which transduces the recovered audio signal to audibility.

In this preferred embodiment of the invention, a blanker gate 40 has been inserted between the mixer stage 20 and the IF stage 26. It should be understood that the gate 40 might be inserted between any of a number of possible stages. The blanker gate 40 is comprised of a pair of transformers 42, 44 each of which has a primary winding 42a, 44a and a secondary winding 42b, 44b, respectively. The first transformer 42 primary winding 42a is part of the tank circuit 24 in the mixer stage 20, and couples signals therefrom. For purposes of tuning the first transformer 42 to the selected IF passband, a capacitor 46 of selected value is supplied in shunt with the first transformer 42 primary winding 42a. In a similar manner, the second transformer 44 secondary winding 44b couples signals to the IF stage 26. To tune the second transformer 44 to the selected IF pass-band frequency, a shunt capacitor 48 is provided.

A pair of coupling capacitors 50, 52 connect the end of the first transformer 42 secondary winding 42b to the second transformer 44 primary winding 44a. The coupling capacitors 50, 52 are preferably of preselected value whereby the transformers 42, 44 and coupling capacitors 50, 52 form a bandpass filter having a Butterworth filter characteristic. As a result of the tuning of the transformers 42, 44 to their associated radio stages the improved blanker noise gate has a minimal effect on signals passed from the mixer stage 40 to the IF stage 26.

Switching to the noise gate 40 is provided by two diode pairs 56, 58. Each diode pair includes two diodes series connected with their anodes connected at a common point. The cathodes of the first diode pair 56 connect to the free end of the first transformer 42 secondary winding 42b. Similarly, the cathodes of the second diode pair 58 connect to the free ends of the second transformer 44 primary winding 44a. A pair of resistors 60, 62 feed from the blanker 16 output to the common anode connections of the diode pairs 56, 58, whereby a pulse from the blanker 16 forward biases the diodes to a conducting state and the first transformer 42 secondary 42b and second transformer 44 primary winding 44a are effectively shunted out. This, of course, prevents signals from being coupled to the blanker 40. When the diodes conduct, opposing current flows through the transformers 42, 44 such that the stored transformer energy due to diode current is reduced. With closely matched transformers, the amount of transformer stored energy is minimized, thereby minimizing the insertion of noise by the blanker upon receiving blanking pulses. Thus, the doubly balanced, tuned blanker gate network creates a minimum of ripple during turn-on and turn-off of the diode switching.

During the absence of a blanker pulse, it is preferable that the diode pairs 56, 58 be turned off thereby eliminating any diode degradation to normal receiver operation. Proper turn off is provided by a biased resistor 66, one end of which connects to a source of DC bias, with the remaining end connecting to the midpoints of the first transformer 42 secondary winding 42b and second transformer 44 primary winding 44a. The DC bias provided through resistor 66 and filtered by an RF filter capacitor 68, acts to actively reverse bias the diode pairs 56, 58 in the absence of a blanking pulse, thereby driving them to a highly non-conductive state.

In summary, an improved noise blanker gate has been described which is adapted for insertion between radio stages. In the normal receiver mode the blanker gate provides minimal disturbance to the received signal. However, upon receiving a blanking signal, the blanker gate responds quickly while turning off with a minimum of ringing.

While a preferred embodiment of the invention has been described, it should be apparent that many modifications and variations thereto are possible, all of which fall within the true spirit of the invention.

For example, while the preferred embodiment employs two diode pairs, it should be apparent that a significant advance over prior art blanker gates may be realized by using either one of the pairs. Also, while the preferred embodiment employed diode switching, it should be understood that the switching might be accomplished by other semiconductor devices such as bipolar transistors or FETs.

We claim:
1. A radio receiver comprising:
an antenna for receiving transmitted ratio frequency signals;
a radio frequency amplifier for amplifying the received signals;
a mixer for translating the received signals to an intermediate frequency;
a blanker for generating blanking signals in response to noise in the received signal;
a blanker gate for processing the intermediate frequency signals and, in response to a blanking signal from the blanker, blanking the intermediate frequency signals, the blanker gate having first and second matched transformers, each transformer having a primary and a secondary winding, the transformers interconnected to form a balanced, doubly tuned network adapted for receiving and tuning to the mixer at its input and tuning to a load at its output, the blanker gate further comprising two diode pairs, each diode pair series connected, with first diode pair being connected in shunt with the first transformer secondary winding and the second pair being connected in shunt with the second transformer primary winding, each diode pair adapted to be activated to a conducting state in response to a blanking signal, said blanker gate including means for coupling, in the absence of said blanking signal, intermediate frequency signals from said first transformer secondary winding to said second transformer primary winding with a minimal disturbance effect;
an intermediate frequency stage for processing the signals at the output of the blanker gate;
a detector stage, coupled to the intermediate frequency stage, for recovering the baseband signal; and
a means for transducing the baseband signal to audibility.

2. The blanker gate of claim 1 wherein the first and second transformers are bifilar wound.

3. The radio receiver of claim 1 wherein the blanker gate includes a pair of capacitors, each capacitor coupled between one end of the first transformer secondary winding and a corresponding end of the second transformer primary winding, the capacitors of selected value such that the transformers and capacitors form a filter having a Butterworth characteristic.

4. The radio receiver of claim 1 wherein each diode pair has the anode of its diodes connected at a common point with each cathode being connected to an end of its corresponding transformer, and the blanking signal is coupled to the common anode points such that the diodes are activated to a conducting state in response to a blanking signal.

5. The radio receiver of claim 4 wherein the blanker gate further comprises a means for applying a DC bias potential to the center points of the first transformer secondary winding and the second transformer primary winding for providing a bias to reverse bias the diodes to a highly non-conducting state in the absence of a blanking signal.

6. The radio receiver of claim 1 wherein the blanker gate doubly tuned network further comprises:
a first capacitor, coupled across the first transformer primary winding, for tuning the first transformer to a selected frequency range; and
a second capacitor, coupled across the second transformer secondary winding, for tuning the second transformer to a selected frequency range.

7. A blanker gate for coupling between first and second stages of a radio receiver and responding to a blanking signal comprising:
first and second matched transformers, each transformer having a primary winding and a secondary winding, the first transformer primary winding coupling signals from the first radio stage, the second transformer secondary winding coupling signals to the second radio stage;

coupling means for coupling signals from the secondary winding of the first transformer to the primary winding of the second transformer, said coupling means including components of predetermined value to form, with said transformers, a filter having a Butterworth characteristic response with a minimal disturbance effect for coupling signals between said first and second transformers;

a signal controlled switch means coupled in shunt with the coupling means and responsive to a blanking signal for preventing signals at the secondary of the first transformer from being coupled to the primary of the second transformer, said signal controlled switch means comprising a pair of diodes, the diodes being series connected with the anodes being connected to a common point, and with each of the cathodes being connected to one of the ends of the first transformer secondary winding; and blanking means for generating a blanking signal and coupling the blanking signal to the common connection point of the diode pair, such that the blanking signal activates the diodes to a conducting stage, said blanking means further comprising means for applying a DC bias potential at the center point of the first transformer secondary winding for providing a bias to reverse bias the diodes to a highly non-conducting state in the absence of a blanking signal.

8. The blanker gate of claim 7 wherein the first and second transformer are bifilar wound.

9. The blanker gate of claim 7 wherein the coupling means comprises a pair of capacitors, each capacitor coupled between one end of the first transformer secondary winding and a corresponding end of the second transformer primary winding.

10. The blanker gate of claim 9 wherein the capacitors are of predetermined value such that the transformers and the capacitors form said filter having a Butterworth characteristic.

11. The blanker gate of claim 7 further comprising a capacitor, coupled across the first transformer primary winding, for tuning the first transformer to a selected frequency range.

12. The blanker gate of claim 7 further comprising a capacitor, coupled across the second transformer secondary winding for tuning the second transformer to a selected frequency range.

13. The blanker gate of claim 7 further comprising:
a first capacitor, coupled across the first transformer primary winding, for tuning the first transformer to a selected frequency range; and
a second capacitor, coupled across the second transformer secondary winding, for tuning the second transformer to a selected frequency range.

14. The blanker gate of claim 7 wherein the first radio stage is a mixer stage and the second radio stage is an intermediate frequency stage.

15. A blanker gate for coupling between first and second stages of a radio receiver and responding to a blanking signal comprising:
first and second matched transformers, each transformer having a primary winding and a secondary winding, the first transformer primary winding coupling signals from the first radio stage, the second transformer secondary winding coupling signals to the second radio stage;

coupling means for coupling signals from the secondary winding of the first transformer to the primary winding of the second transformer, said coupling means including components of predetermined value to form, with said transformers, a filter having a Butterworth characteristic response with a minimal disturbance effect for coupling signals between said first and second transformers; and a signal controlled switch means coupled in shunt with the coupling means and responsive to a blanking signal for preventing signals at the secondary of the first transformer from being coupled to the primary of the second transformer, said signal controlled switch means comprising two diode pairs, each diode pair having the diodes series connected with the anodes being connected to a common point, each cathode of the first diode pair being connected to one of the ends of the first transformer secondary winding, and each of the cathodes of the second diode pair being connected to one of the ends of the second transformer primary winding; and blanking means for generating a blanking signal and coupling the blanking signal to the common connection points of the two diode pairs such that the blanking signal activates the diodes to a conducting stage, said blanking means further comprising means for applying a DC bias potential at the center points of the first transformer secondary winding and the second transformer primary winding for providing a bias to reverse bias the diodes to a highly non-conducting stage in the absence of a blanking signal.

16. The blanker gate of claim 15 wherein the first and second transformers are bifilar wound.

17. The blanker gate of claim 15 wherein the coupling means comprises a pair of capacitors, each capacitor coupled between one end of the first transformer secondary winding and a corresponding end of the second transformer primary winding.

18. The blanker gate of claim 15 wherein the capacitors are of predetermined value such that the transformers and the capacitors form said filter having a Butterworth characteristic.

19. The blanker gate of claim 15 further comprising a capacitor, coupled across the first transformer primary winding, for tuning the first transformer to a selected frequency range.

20. The blanker gate of claim 15 further comprising a capacitor, coupled across the second transformer secondary winding for tuning the second transformer to a selected frequency range.

21. The blanker gate of claim 15 further comprising:
a first capacitor, coupled across the first transformer primary winding, for tuning the first transformer to a selected frequency range; and
a second capacitor, coupled across the second transformer secondary winding, for tuning the second transformer to a selected frequency range.

22. The blanker gate of claim 15 wherein the first radio stage is a mixer stage and the second radio stage is an intermediate frequency stage.

* * * * *

UNITED STATES PATENT AND TRADEMARK OFFICE
CERTIFICATE OF CORRECTION

PATENT NO. : 4,203,073
DATED : May 13, 1980
INVENTOR(S) : James W. Rae ET AL.

It is certified that error appears in the above-identified patent and that said Letters Patent are hereby corrected as shown below:

Col. 1, line 12, "ratio" should be --radio--.

Col. 2, line 27, "n" should be inserted after --i--.

Col. 3, line 61, "ratio" should be --radio--.

Col. 4, line 12, "with" first occurrence should be -- the --.

Col. 6, line 35, "stage" should be --state--.

Signed and Sealed this

Ninth Day of September 1980

[SEAL]

Attest:

SIDNEY A. DIAMOND

Attesting Officer    Commissioner of Patents and Trademark